United States Patent
Fujii et al.

(10) Patent No.: US 7,235,500 B2
(45) Date of Patent: Jun. 26, 2007

(54) MATERIAL FOR FORMING SILICA BASED FILM

(75) Inventors: Yasushi Fujii, Kawasaki (JP); Tatsuhiko Shibuya, Kawasaki (JP); Isao Sato, Kawasaki (JP)

(73) Assignee: Tokyo Ohka Kogyo Co., Ltd. (JP)

( * ) Notice: Subject to any disclaimer, the term of this patent is extended or adjusted under 35 U.S.C. 154(b) by 0 days.

(21) Appl. No.: 11/000,735

(22) Filed: Dec. 1, 2004

(65) Prior Publication Data

US 2005/0136692 A1 Jun. 23, 2005

(30) Foreign Application Priority Data

Dec. 10, 2003 (JP) .............................. 2003-412380

(51) Int. Cl.
H01L 21/31 (2006.01)
H01L 21/469 (2006.01)

(52) U.S. Cl. ................ 438/778; 438/782; 257/E21.494

(58) Field of Classification Search ................ 438/778, 438/782, 781; 257/E21.494; 427/397.7
See application file for complete search history.

(56) References Cited

U.S. PATENT DOCUMENTS

| | | | |
|---|---|---|---|
| 3,450,672 A * | 6/1969 | Merrill | 528/12 |
| 3,709,801 A * | 1/1973 | Tripp | 205/420 |
| 4,865,649 A | 9/1989 | Kashiwagi et al. | |
| 5,840,821 A | 11/1998 | Nakano et al. | |
| 6,140,150 A | 10/2000 | Efland et al. | |
| 6,329,456 B1 * | 12/2001 | Okibe et al. | 524/264 |
| 6,410,151 B1 | 6/2002 | Kurosawa et al. | |
| 6,503,633 B2 | 1/2003 | Nishikawa et al. | |
| 6,509,423 B1 * | 1/2003 | Zhu | 525/478 |
| 6,589,644 B1 | 7/2003 | Yamad et al. | |
| 6,624,237 B2 * | 9/2003 | Biteau et al. | 524/588 |
| 6,737,118 B2 | 5/2004 | Yamada et al. | |
| RE38,850 E * | 10/2005 | Ikenaga et al. | 428/448 |
| 2001/0055892 A1 | 12/2001 | Nishikawa et al. | |
| 2002/0189495 A1 | 12/2002 | Hayashi et al. | |
| 2003/0035888 A1 * | 2/2003 | Eriyama et al. | 427/212 |
| 2004/0033882 A1 * | 2/2004 | Barney et al. | 501/95.1 |
| 2004/0180223 A1 * | 9/2004 | Shibuya et al. | 428/447 |

FOREIGN PATENT DOCUMENTS

DE 698 20 289 T2 11/2004

(Continued)

OTHER PUBLICATIONS

U.S. Appl. No. 10/616,731, filed Jul. 10, 2003, Tatsuhiko Shibuya et al.

(Continued)

Primary Examiner—Caridad Everhart
(74) Attorney, Agent, or Firm—Knobbe, Martens, Olson and Bear, LLP

(57) ABSTRACT

A material for forming a silica based film which enables the production of a silica based film with a reduced etching rate relative to hydrofluoric acid. This material includes a solid fraction containing a film forming component capable of generating a silica based film, an organic solvent, and water, and the water content of the material, as determined by gas chromatography measurement, is within a range from 0.1 to 50% by weight.

15 Claims, 3 Drawing Sheets

FOREIGN PATENT DOCUMENTS

| | | |
|---|---|---|
| EP | 0 686 680 A1 | 12/1993 |
| EP | 0 931 820 A1 | 1/1999 |
| JP | 63-241076 | 10/1988 |
| JP | 63241076 A | 10/1988 |
| JP | 7-97548 | 4/1995 |
| JP | 07097548 A | 4/1995 |
| JP | 10-313002 | 11/1998 |
| JP | 10313002 A | 11/1998 |
| JP | 11-251310 | 9/1999 |
| JP | 11251310 A | 9/1999 |
| JP | 2000-340651 | 12/2000 |
| JP | 2001-210633 | 8/2001 |
| JP | 2003-253206 | 9/2003 |
| JP | 2003-292626 | 10/2003 |
| WO | WO 95/24639 | 9/1995 |
| WO | WO 2004/090058 A1 | 10/2004 |

OTHER PUBLICATIONS

Office Action from the Taiwan Patent Office issued on corresponding Taiwan Patent Application No. 093137222.

Office Action from the German Patent Office issued on corresponding German Patent Application No. 10 2004 058 042.1-43 (English translation).

* cited by examiner

MATERIAL FOR FORMING SILICA BASED FILM

BACKGROUND OF THE INVENTION

1. Field of the Invention

The present invention relates to a material for forming a silica based film.

Priority is claimed on Japanese Patent Application No. 2003-412380, filed Dec. 10, 2003, the content of which is incorporated herein by reference.

2. Description of Related Art

Conventionally, in the production of substrates for semiconductor elements and liquid crystal elements, SOG (spin-on-glass) is a known technique used in the production of planarizing films, interlayer insulating films, passivation films, as well as the raw material solutions used for producing these films. SOG is a generic term that is typically used to describe both solutions comprising a silicon compound dissolved in an organic solvent (hereafter also referred to as SOG solutions), and silica based films (hereafter also referred to as SOG films) comprising $SiO_2$ as the primary component, formed by applying a SOG solution to a substrate and conducting a subsequent heat treatment.

A variety of silica based films have been proposed (see patent references 1 to 4, listed below).

Silica based films formed using chemical vapor deposition methods (hereafter also abbreviated as CVD methods) are formed in a conformal manner relative to the wiring pattern, meaning that following film formation, they must be subjected to reflow at a high temperature of 950 to 1100° C. in order to flatten the surface of the film.

In contrast, SOG films can be formed with a flat surface by applying a SOG solution, and then conducting baking at a temperature that is lower than the above reflow temperature. Such SOG films display excellent surface planarity.

Patent Reference 1:
Japanese Examined Patent Application, Second Publication No. Hei 8-3074 B
Patent Reference 2:
Japanese Patent (Granted) Publication No. 2,739,902
Patent Reference 3:
Japanese Patent (Granted) Publication No. 3,228,714
Patent Reference 4:
Japanese Unexamined Patent Application, First Publication No. Hei 10-313002 A However, with recent further advances in the miniaturization of semiconductor devices, the use of SOG films is becoming restricted due to the high etching rate of SOG films by hydrofluoric acid. For example, use of a SOG film as the insulating film of so-called PMD (Predetermined Metal Dielectrics) provided on top of a metal wiring pattern in a device with a gate length of no more than 0.18 μm is problematic.

Specifically, if a contact hole is formed by penetrating through the SOG film, and the inside of the contact hole is then washed with hydrofluoric acid, then the SOG film from the inside walls of the contact hole is also etched in a horizontal direction relative to the substrate, causing so-called side etching.

This side etching is most prevalent at the bottom sections of the SOG film, namely, the sections of the film closest to the substrate in the film depth direction.

In the case of substrates for the next generation of devices, some substrates covered with a film formed by a CVD method can comprise ultra fine indentations with a width between wiring (the wiring separation) of no more than 0.25 μm and a depth (step) of at least 0.4 μm. A SOG film formed on top of this type of substrate must be capable of filling these spaces between wiring without generating voids. In addition, if side etching of the SOG film which fills the indentations between wiring sections to planarize the substrate surface occurs, then short circuits can develop within the wiring, and consequently it is becoming increasingly important to reduce the etching rate of SOG films by hydrofluoric acid, thus preventing side etching.

SUMMARY OF THE INVENTION

Accordingly, an object of the present invention is to provide a material for forming a silica based film which enables a reduction in the wet etching rate of the produced silica based film.

In order to achieve this object, a material for forming a silica based film according to the present invention comprises a solid fraction containing a film forming component capable of generating a silica based film, an organic solvent and water, wherein the water content of the material, as determined by gas chromatography measurement, is within a range from 0.1 to 50% by weight.

By ensuring that the water content of the material for forming the silica based film, as determined by gas chromatography measurement, falls within the above range, the resistance to etchants of the silica based film formed from the material can be improved, enabling a reduction in the wet etching rate.

DETAILED DESCRIPTION OF THE INVENTION

Figure 1:
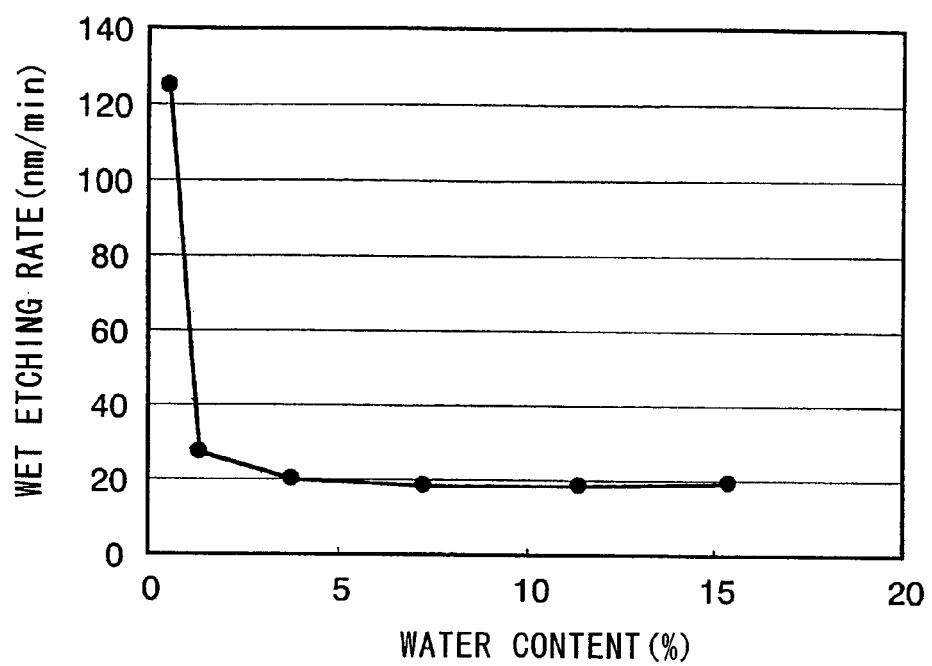
FIG. 1 is a graph showing the relationship between the wet etching rate and the water content for a series of examples.

The material for forming a silica based film according to the present invention comprises a solid fraction containing a film forming component, an organic solvent, and water.

The film forming component is a component that forms a silica based film comprising $SiO_2$ as a primary constituent, and more specifically, is a component capable of forming a polysiloxane.

In this description, for the sake of convenience, the description of this film forming component is divided into a description of an organic group-containing film-forming component, which contains a linkage represented by the formula Si—R (wherein, R represents an alkyl group of 1 to 4 carbon atoms or a phenyl group, and the alkyl group may be either a straight chain or a branched group), and a description of an inorganic film-forming component which contains no such Si—R linkages.

[Organic Group-Containing Film-Forming Component]

Specific examples of the organic group-containing film-forming component include the reaction products generated by subjecting a silicon compound, which contains at least one compound selected from a group consisting of silicon compounds (1) represented by a general formula (I) shown below and silicon compounds (2) represented by a general formula (II) show below, to hydrolysis treatment in an organic solvent, in the presence of an acid catalyst and water. The alkyl groups represented by the groups $R^1$ to $R^4$ may be either straight chain groups or branched groups.

The silicon compound used for generating the organic group-containing film-forming component may comprise solely an aforementioned silicon compound (1) and/or a silicon compound (2), or may also include arbitrary quantities of an additional silicon compound or compounds that contain no Si—R linkages, specifically the silicon compounds (3) represented by a general formula (III) shown below, and/or the silicon compounds (4) represented by a general formula (IV) shown below.

$$R^1{}_2Si(OR^2)_2 \quad (I)$$

In this formula, $R^1$ represents an alkyl group of 1 to 4 carbon atoms or a phenyl group, and $R^2$ represents an alkyl group of 1 to 4 carbon atoms.

$$R^3Si(OR^4)_3 \quad (II)$$

In this formula, $R^3$ represents an alkyl group of 1 to 4 carbon atoms or a phenyl group, and $R^4$ represents an alkyl group of 1 to 4 carbon atoms.

Examples of preferred forms of the silicon compound (1) include dialkyldialkoxysilanes such as dimethyldimethoxysilane, dimethyldiethoxysilane, dimethyldipropoxysilane, diethyldimethoxysilane, diethyldiethoxysilane, diethyldipropoxysilane, dipropyldimethoxysilane, dipropyldiethoxysilane and dipropyldipropoxysilane; and diphenyldialkoxysilanes such as diphenyldimethoxysilane and diphenyldiethoxysilane. These compounds can be used singularly, or in combinations of two or more different compounds. Of the above compounds, dialkyldialkoxysilanes are particularly preferred.

Compounds in which $R^1$ represents a methyl group are low cost, readily available, and produce a film of high film density, and are consequently particularly preferred.

Examples of preferred forms of the silicon compound (2) include monoalkyltrialkoxysilanes such as monomethyltrimethoxysilane, monomethyltriethoxysilane, monomethyltripropoxysilane, monoethyltrimethoxysilane, monoethyltriethoxysilane, monoethyltripropoxysilane, monopropyltrimethoxysilane and monopropyltriethoxysilane; and monophenyltrialkoxysilanes such as monophenyltrimethoxysilane and monophenyltriethoxysilane. These compounds can be used singularly, or in combinations of two or more different compounds. Of the above compounds, monoalkyltrialkoxysilanes are particularly preferred.

Compounds in which $R^3$ represents a methyl group are low cost, readily available, and produce a film of high film density, and are consequently particularly preferred.

[Inorganic Film-Forming Component]

Specific examples of the inorganic film-forming component include the reaction products generated by subjecting at least one compound selected from a group consisting of silicon compounds (3) represented by the general formula (III) shown below and silicon compounds (4) represented by the general formula (IV) shown below to hydrolysis treatment in an organic solvent, in the presence of an acid catalyst and water. The silicon compound of this inorganic film-forming component uses only silicon compounds that contain no Si—R linkages. The alkyl groups represented by the groups $R^5$ and $R^6$ in the general formulas (III) and (IV) may be either straight chain groups or branched groups.

$$Si(OR^5)_4 \quad (III)$$

In this formula, $R^5$ represents an alkyl group of 1 to 4 carbon atoms.

$$HSi(OR^6)_3 \quad (IV)$$

In this formula, $R^6$ represents an alkyl group of 1 to 4 carbon atoms.

Examples of preferred forms of the silicon compound (3) include tetraalkoxysilanes such as tetramethoxysilane, tetraethoxysilane, tetrapropoxysilane and tetrabutoxysilane. These compounds can be used singularly, or in combinations of two or more different compounds.

Examples of preferred forms of the silicon compound (4) include trimethoxysilane, triethoxysilane, tripropoxysilane, tributoxysilane, diethoxymonomethoxysilane, monomethoxydipropoxysilane, dibutoxymonomethoxysilane, ethoxymethoxypropoxysilane, monoethoxydimethoxysilane, monoethoxydipropoxysilane, butoxyethoxypropoxysilane, dimethoxymonopropoxysilane, diethoxymonopropoxysilane and monobutoxydimethoxysilane. Of these, the most preferred compounds from a practical viewpoint are the trialkoxysilanes such as trimethoxysilane, triethoxysilane, tripropoxysilane and tributoxysilane, and of these, trimethoxysilane and triethoxysilane are particularly desirable. These compounds can be used singularly, or in combinations of two or more different compounds.

As the organic solvent, any of the organic solvents typically used in conventional applications can be used. Specific examples of suitable solvents include monovalent alcohols such as methyl alcohol, ethyl alcohol, propyl alcohol and butyl alcohol; alkyl carboxylate esters such as methyl 3-methoxypropionate and ethyl 3-ethoxypropionate; polyvalent alcohols such as ethylene glycol, diethylene glycol and propylene glycol; and derivatives of polyvalent alcohols such as ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol dipropyl ether, ethylene glycol dibutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, ethylene glycol monomethyl ether acetate, ethylene glycol monoethyl ether acetate, propylene glycol monomethyl ether acetate and propylene glycol monoethyl ether acetate; fatty acids such as acetic acid and propionic acid; and ketones such as acetone, methyl ethyl ketone and 2-heptanone. These organic solvents can be used singularly, or in combinations of two or more different solvents.

Of the above solvents, the use of monovalent alcohols, ketones, glycol based polyvalent alcohols, polyvalent alcohol derivatives and alkoxycarboxylate esters are preferred in terms of improving the ease of application of the material for forming a silica based film.

A material for forming a silica based film according to the present invention can be prepared by dissolving one or more compounds selected from amongst the above silicon compounds (1) to (4) in an organic solvent, and then conducting a hydrolysis treatment in the presence of an acid catalyst and water, with the resulting reaction product acting as the film forming component. An additional step for adjusting the water content may be added if necessary.

In those cases where two or more silicon compounds are combined, two different methods are possible. Namely, a method in which a mixture of the silicon compounds is subjected to hydrolysis, and a method in which each compound is subjected to hydrolysis individually, and the resulting products are then combined. The material for forming a silica based film of the present invention can be prepared by either method, although the former method, in which the hydrolysis is conducted after mixing of the compounds, is preferred as it offers fewer production steps meaning better efficiency, and produces better uniformity within the resulting silica based film. This description focuses on the method in which the hydrolysis is conducted after mixing.

First, the silicon compound is dissolved in an organic solvent to generate a silicon compound solution. In those cases where two or more silicon compounds are used, these compounds may be either mixed together in advance and the resulting mixture then added to the organic solvent, or added separately and then mixed within the organic solvent.

The quantity used of the organic solvent preferably amounts to 10 to 30 mols of the solvent per 1 mol of the silicon compound used in the preparation of the material for forming a silica based film.

The silicon compound solution may also contain suitable quantities of optional components such as surfactants for improving the ease of application, and acid components that promote the dehydration condensation reaction during baking.

Subsequently, an acid catalyst and water are added to the thus obtained silicon compound solution to effect the hydrolysis treatment.

The water and the acid catalyst may be either added separately to the silicon compound solution, or an aqueous solution of the acid catalyst produced by mixing the catalyst with either a portion of, or all of, the water may be added.

The hydrolysis treatment may result in either complete hydrolysis or partial hydrolysis of the silicon compound within the solution. The degree of hydrolysis can be adjusted by altering the quantity of water added.

If the quantity of water added is too small, then the degree of hydrolysis decreases, and the level of out-gas during film formation increases, which is undesirable. In contrast if the quantity of water added is too large, then the material for forming the silica based film becomes more prone to gelling, causing an undesirable deterioration in the storage stability. Accordingly, the quantity of water added is preferably set within a range from 2 to 12 mols, and even more preferably from 4 to 8 mols, for every 1 mol of the combination of silicon compounds used in preparing the material for forming the silica based film.

As the acid catalyst, any of the organic acids or inorganic acids typically used in conventional applications can be used. Specific examples of suitable organic acids include organic carboxylic acids such as acetic acid, propionic acid and butyric acid. Specific examples of suitable inorganic acids include hydrochloric acid, nitric acid, sulfuric acid and phosphoric acid.

The quantity added of the acid catalyst is preferably set so that following addition, the acid concentration within the silicon compound solution is within a range from 1 to 1000 ppm, and even more preferably from 5 to 500 ppm.

The acid catalyst and water are preferably added gradually while the silicon compound solution is stirred, and following completion of the addition, the resulting solution is left to stand to allow the hydrolysis reaction to proceed. The hydrolysis reaction requires from 5 to 100 hours, although if the silicon compound solution is heated to a temperature not exceeding 80° C., and the acid catalyst solution is then added dropwise to the stirred silicon compound solution, then the time required for the hydrolysis reaction can be appropriately shortened.

In all of the above silicon compounds (1) through (4), hydrolysis in the presence of an acid catalyst and water causes the alkoxy group to be converted to a silanol group. At the same time, this silanol group causes an intermolecular dehydration condensation reaction, which generates a siloxane linkage. This type of siloxane linkage displays a film forming property.

The reaction product obtained by subjecting one or more of the silicon compounds (1) through (4) to hydrolysis treatment in an organic solvent in the presence of an acid catalyst, comprises mainly siloxane oligomers with degrees of polymerization from 2 to 20. The weight average molecular weight of the reaction product is preferably within a range from 1000 to 10,000, and even more preferably from 1500 to 3000. Provided the weight average molecular weight of the reaction product is within a range from 1000 to 10,000, a material for forming a silica based film is produced that is capable of forming a film with favorable surface planarity. If the weight average molecular weight exceeds 10,000, then the material becomes prone to gelling, whereas if the molecular weight is less than 1000, the film forming property of the material is poor. The weight average molecular weight of the reaction product can be controlled by altering factors such as the quantity of water added to the hydrolysis reaction, the reaction time, the reaction temperature and the aging time.

A material for forming a silica based film according to the present invention has a water content, as determined by gas chromatography measurement, that falls within a range from 0.1 to 50% by weight.

In those cases where the film forming component comprises an organic group-containing film-forming component containing an Si—R linkage, the water content is preferably within a range from 1 to 30% by weight, and even more preferably from 5 to 28% by weight, and most preferably from 12 to 25% by weight. In contrast, in those cases where the film forming component comprises an inorganic film-forming component containing no Si—R linkages, the water content is preferably within a range from 3 to 20% by weight, and even more preferably from 5 to 18% by weight, and most preferably from 7 to 15% by weight.

By ensuring that the water content of the material for forming the silica based film, as determined by gas chromatography measurement, is equal to or exceeds the lower limit of the above range, the resistance of the film to wet etching by hydrofluoric acid can be increased effectively. It is believed that the reason for this improvement is that as the action of the water causes the hydrolysis reaction to proceed within the film, the quantity of residual alkoxyl groups decreases, causing the film to become more dense. Furthermore, provided the water content is kept at a level equal to or above the lower limit of the above range, the film thickness uniformity within the substrate surface can also be improved. If the water content exceeds the above upper limit, then there is a danger of the following types of undesirable phenomena occurring: a deterioration in the storage stability of the material for forming the silica based film; an increased danger that the material may freeze if placed in refrigerated storage; a tendency for the ease of application to deteriorate if the solid fraction concentration is increased, and other similar problems.

In this description, the term "solid fraction" refers to the combination of the reaction product generated by the hydrolysis of the silicon compound, any unreacted silicon compound, the acid catalyst, and any other optional components. The combined weight of the reaction product generated by the hydrolysis of the silicon compound and any unreacted silicon compound is calculated as a $SiO_2$ equivalent value. Accordingly, even in the case of $CH_3$—$SiO_{3/2}$, or in cases in which a proportion of residual alkoxyl groups are still present, the weight is still calculated as $SiO_2$ (Mw=60).

The water content within a material for forming a silica based film can be measured using gas chromatography. Gas chromatography measurements enable quantitative analysis of each of the solvent components within the material, namely the organic solvent that is added to the material to dissolve the aforementioned solid fraction, alcohol that is generated as a by-product from the hydrolysis reaction, and water. Accordingly, the proportion of water contained within the combination of all the components can be specified as the value determined by this type of measurement.

In other words, the term "water content" defined in the present invention refers to the water content contained within the combination of all the components, as determined by submitting the material of the present invention to gas chromatography measurement. This value is substantially equal to the water content of the solvent component within the material.

There are no particular restrictions on the gas chromatography conditions, provided the water content can be determined, and for example, measurement can be conducted under the conditions described below.

Apparatus: Hitachi 263-80 (product name, manufactured by Hitachi Ltd.) Column: stainless steel column (internal diameter 3 mm, total length 2 m) packed with Porapack Q powdered filler (product name, manufactured by Waters Corporation, MESH 50-80).

Sample volume: 1 microliter

Helium flow rate: 27 ml/minute

Sample injection temperature: 250° C.

Following injection of the sample, measurement is conducted by holding the temperature at 80° C. for 2 minutes, subsequently raising the temperature to 235° C. at a rate of 20° C./minute, and then holding that temperature for a further 11 minutes.

Detector: thermal conductivity detector.

There are no particular restrictions on the method used for controlling the water content within the material for forming a silica based film. In one suitable method, when the water is added to the aforementioned silicon compound solution to effect the hydrolysis treatment, excess water is added beyond the quantity of water required for the hydrolysis reaction, and the reaction time is then controlled and the hydrolysis reaction halted at a point where the water content within the material for forming a silica based film falls within the preferred range described above.

Furthermore, a method in which following completion of the hydrolysis treatment of the silicon compound, moisture is first removed from the solution, and then additional water is added can also be used to generate a material for forming a silica based film in which the water content falls within the preferred range described above.

Even a method in which water is added to the solution following completion of the hydrolysis treatment of the silicon compound can be used to generate a material for forming a silica based film in which the water content falls within the preferred range described above.

Furthermore, in the material for forming a silica based film according to the present invention, the Si content within the solid fraction is preferably within a range from 1 to 20% by weight, and even more preferably from 6 to 15% by weight.

The Si content within the solid fraction can be determined by, for example, applying a predetermined quantity of the material for forming a silica based film to a substrate, drying the material, conducting a heat treatment at 500° C., and measuring the weight of $SiO_2$ obtained, and then using the quantity of Si calculated from this weight, and the weight of material applied to the substrate to determine the Si content.

If the Si content within the solid fraction of the material for forming a silica based film is less than the above range, then ensuring the desired film thickness can become difficult, whereas if the content is greater than the above range, the storage stability of the material tends to deteriorate.

The Si content within the solid fraction of the material for forming a silica based film can be controlled by altering the quantity of the silicon compound used in preparing the material for forming a silica based film.

A material for forming a silica based film prepared in the manner described above may be suitably diluted with an organic solvent if required, and is then applied to the treatment target on which the silica based film is to be formed. If dilution is required, the diluting organic solvent can use the same organic solvents as those used in forming the silicon compound solution. If the material is diluted, the water content within the material must still be controlled within the range prescribed by the present invention.

Following application of the material for forming a silica based film to the surface of the treatment target and formation of a coating, the thus formed coating is baked. This heating removes the organic solvent from within the coating, and also promotes a dehydration condensation reaction, thus forming a polysiloxane film, and completing formation of the silica based film.

In those cases where the material for forming a silica based film contains an organic group-containing film-forming component, the baking temperature is preferably within a range from 350 to 750° C., and even more preferably from 400 to 700° C. If the baking temperature is lower than this range, then the organic solvent removal and the promotion of the dehydration condensation reaction may be inadequate, whereas if the temperature is higher than this range, then the alkyl groups bonded to silicon are prone to dissociation. Furthermore, if the baking time is too short, then the organic solvent removal and the promotion of the dehydration condensation reaction may be inadequate, whereas if too long, the throughput deteriorates, and consequently the baking time is preferably set within a range from 20 to 120 minutes, and even more preferably from 30 to 60 minutes.

In those cases where the material for forming a silica based film contains an inorganic film-forming component, the baking temperature is preferably within a range from 250 to 1100° C., and even more preferably from 300 to 900° C. If the baking temperature is lower than this range, then the organic solvent removal and the promotion of the dehydration condensation reaction may be inadequate, whereas if the temperature is higher than this range, then there is a possibility that other materials in the lower layers may be damaged. Furthermore, if the baking time is too short then the organic solvent removal and the promotion of the dehydration condensation reaction may be inadequate, whereas if too long, the throughput deteriorates, and consequently the baking time is preferably set within a range from 20 to 120 minutes, and even more preferably from 30 to 60 minutes.

Using a material for forming a silica based film according to the present invention, a silica based film with a reduced etching rate by hydrofluoric acid can be obtained. Accordingly, this material is ideal for forming a silica based film used as the insulating film (PMD) provided on top of a metal wiring pattern, for example. Moreover, if a contact hole formed in a silica based film produced using such a material is washed with hydrofluoric acid, then side etching can be effectively prevented.

Furthermore, a silica based film formed using a material for forming a silica based film according to the present invention also displays reduced levels of out-gas during heating, meaning film shrinkage caused by gas volatilization can be suppressed, resulting in a reduced shrinkage rate. Furthermore, by using this type of material, other phenomena caused by film shrinkage, such as crack occurrence or deterioration in the adhesion with adjacent layers, can also be suppressed. It is thought that these effects are due to the reduced quantity of residual alkoxyl groups. Furthermore, a material for forming a silica based film according to the present invention displays improved film thickness uniformity within the substrate surface of the film, meaning the material is ideal for forming silica based films for use as interlayer insulating films or planarizing films.

In addition, by using a material for forming a silica based film according to the present invention, the hardness of the resulting silica based film can be improved. It is surmised that this effect is the result of an increase in the density of the film caused by the reduction in the quantity of residual alkoxyl groups.

EXAMPLES

Example 1

Inorganic Film-forming Component 230.2 g of tetramethoxysilane was dissolved in 560 g of ethylene glycol monomethyl ether (MC), yielding a silicon compound solution. Following the addition of 218.2 g of pure water and 300 microliters of nitric acid to this solution and subsequent stirring, the solution was left to stand for 5 days at room temperature, and was then subjected to distillation using an evaporator. 30 g of the residue following distillation was combined with 6.4 g of MC, yielding a material for forming a silica based film with a $SiO_2$ equivalent solid fraction concentration of 9.86% by weight.

Gas chromatography measurement of the thus obtained material for forming a silica based film revealed a water content of 0.6% by weight.

The measurement conditions were as described below.

Apparatus: Hitachi 263-80 (product name, manufactured by Hitachi Ltd.)

Column: stainless steel column (internal diameter 3 mm, total length 2 m) packed with PORAPACK Q powdered filler (product name, manufactured by Waters Corporation, MESH 50–80).

Sample volume: 1 microliter

Helium flow rate: 27 ml/minute

Sample injection temperature: 250° C.

Following injection of the sample, measurement was conducted by holding the temperature at 80° C. for 2 minutes, subsequently raising the temperature to 235° C. at a rate of 20° C./minute, and then holding that temperature for a further 11 minutes.

Detector: thermal conductivity detector.

Example 2

Inorganic Film-forming Component

With the exception of replacing the 6.4 g of MC added to the 30 g of residue following distillation with 0.24 g of distilled water and 6.16 g of MC (total 6.4 g), a material for forming a silica based film with a $SiO_2$ equivalent solid fraction concentration of 9.86% by weight was produced in the same manner as the example 1.

Gas chromatography measurement of the thus obtained material for forming a silica based film in a similar manner to that described in the example 1 revealed a water content of 1.4% by weight.

Example 3

Inorganic Film-forming Component

With the exception of replacing the 6.4 g of MC added to the 30 g of residue following distillation with 1.22 g of distilled water and 5.18 g of MC (total 6.4 g), a material for forming a silica based film with a $SiO_2$ equivalent solid fraction concentration of 9.86% by weight was produced in the same manner as the example 1.

Gas chromatography measurement of the thus obtained material for forming a silica based film in a similar manner to that described in the example 1 revealed a water content of 3.8% by weight.

Example 4

Inorganic Film-forming Component

With the exception of replacing the 6.4 g of MC added to the 30 g of residue following distillation with 2.76 g of distilled water and 3.64 g of MC (total 6.4 g), a material for forming a silica based film with a $SiO_2$ equivalent solid fraction concentration of 9.86% by weight was produced in the same manner as the example 1.

Gas chromatography measurement of the thus obtained material for forming a silica based film in a similar manner to that described in the example 1 revealed a water content of 7.3% by weight.

Example 5

Inorganic Film-forming Component)

With the exception of replacing the 6.4 g of MC added to the 30 g of residue following distillation with 4.47 g of distilled water and 1.93 g of MC (total 6.4 g), a material for forming a silica based film with a $SiO_2$ equivalent solid fraction concentration of 9.86% by weight was produced in the same manner as the example 1.

Gas chromatography measurement of the thus obtained material for forming a silica based film in a similar manner to that described in the example 1 revealed a water content of 11.4% by weight.

Example 6

Inorganic Film-forming Component

With the exception of replacing the 6.4 g of MC added to the 30 g of residue following distillation with 6.4 g of distilled water, a material for forming a silica based film with a $SiO_2$ equivalent solid fraction concentration of 9.86% by weight was produced in the same manner as the example 1.

Gas chromatography measurement of the thus obtained material for forming a silica based film in a similar manner to that described in the example 1 revealed a water content of 15.4% by weight.

Comparative Example 1

Organic Group-containing Film-forming Component 272.4 g of methyltrimethoxysilane and 101.5 g of tetramethoxysilane were dissolved in 114.1 g of propylene glycol monopropyl ether (PGP), yielding a silicon compound solution. Following the addition of 312 g of pure water and 96.6 microliters of nitric acid to this solution and subsequent stirring, the solution was left to stand for 5 days at room temperature, and was then subjected to distillation using an evaporator. PGP was then added to the residue following distillation, yielding a material for forming a silica based film with a $SiO_2$ equivalent solid fraction concentration of 7% by weight.

Gas chromatography measurement of the thus obtained material for forming a silica based film revealed a water content of 0% by weight.

Example 7

Organic Group-containing Film-forming Component

The same method as the comparative example 1 was followed, but distilled water was added to the residue following distillation, in sufficient quantity to produce a water content of 4% by weight, and PGP was then added, yielding a material for forming a silica based film with a $SiO_2$ equivalent solid fraction concentration of 7% by weight.

Example 8

Organic Group-containing Film-forming Component

A material for forming a silica based film with a water content of 8% by weight and a $SiO_2$ equivalent solid fraction concentration of 7% by weight was prepared in the same manner as the example 7.

A material for forming a silica based film with a water content of 12% by weight and a $SiO_2$ equivalent solid fraction concentration of 7% by weight was prepared in the same manner as the example 7.

A material for forming a silica based film with a water content of 16% by weight and a $SiO_2$ equivalent solid fraction concentration of 7% by weight was prepared in the same manner as the example 7.

A material for forming a silica based film with a water content of 20% by weight and a $SiO_2$ equivalent solid fraction concentration of 7% by weight was prepared in the same manner as the example 7.

A material for forming a silica based film with a water content of 30% by weight and a $SiO_2$ equivalent solid fraction concentration of 7% by weight was prepared in the same manner as the example 7.

(Silica Based Film Formation 1)

Using each of the materials for forming silica based films obtained in the above examples 1 through 6, a series of silica based films were formed on substrates.

Specifically, each material for forming a silica based film obtained in one of the examples 1 through 6 was applied to the surface of a 6 inch silicon substrate using a spinner method (using a TR-6132U application device (product name, manufactured by Tokyo Ohka Kogyo Co., Ltd.)), and the revolution speed was adjusted appropriately to enable formation of a coating with a dried thickness of approximately 210 to 250 nm.

Subsequently, the thus formed coating was dried for 1 minute at 80° C., 1 minute at 150° C., and a further 1 minute at 200° C.

The structure was then placed in a vertical kiln under a nitrogen atmosphere, and baked at 400° C. for 30 minutes, thus forming a silica based film with a film thickness of approximately 180 to 220 nm.

(Silica Based Film Formation 2)

Using each of the materials for forming silica based films obtained in the above comparative example 1 and the examples 7 through 12, a series of silica based films were formed on substrates.

Specifically, each material for forming a silica based film obtained in either the comparative example 1 or one of the examples 7 through 12 was applied to the surface of a 6 inch silicon substrate using a spinner method (using a TR-6132U application device (product name, manufactured by Tokyo Ohka Kogyo Co., Ltd.)), and the revolution speed was adjusted appropriately to enable formation of a coating with a dried thickness of approximately 200 to 230 nm.

Subsequently, the thus formed coating was dried for 1 minute at 80° C., 1 minute at 150° C., and a further 1 minute at 200° C.

The structure was then placed in a vertical kiln under a nitrogen atmosphere, and baked at 700° C. for 30 minutes, thus forming a silica based film with a film thickness of approximately 190 to 220 nm.

(Evaluation of Characteristics 1)

Figure 2:
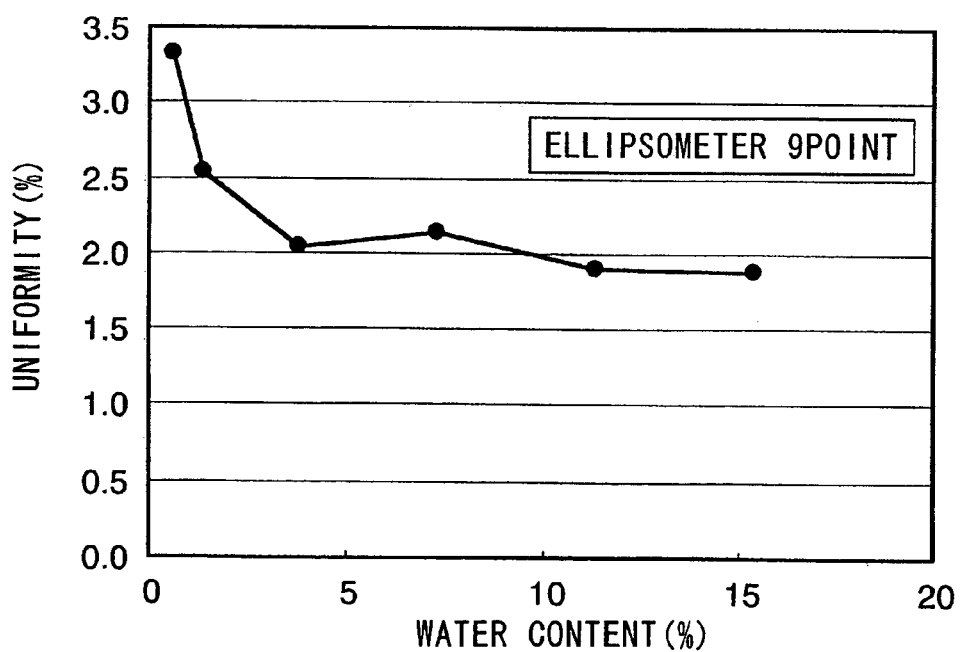
FIG. 2 is a graph showing the relationship between the film thickness uniformity within the substrate surface and the water content for a series of examples.
Figure 3:
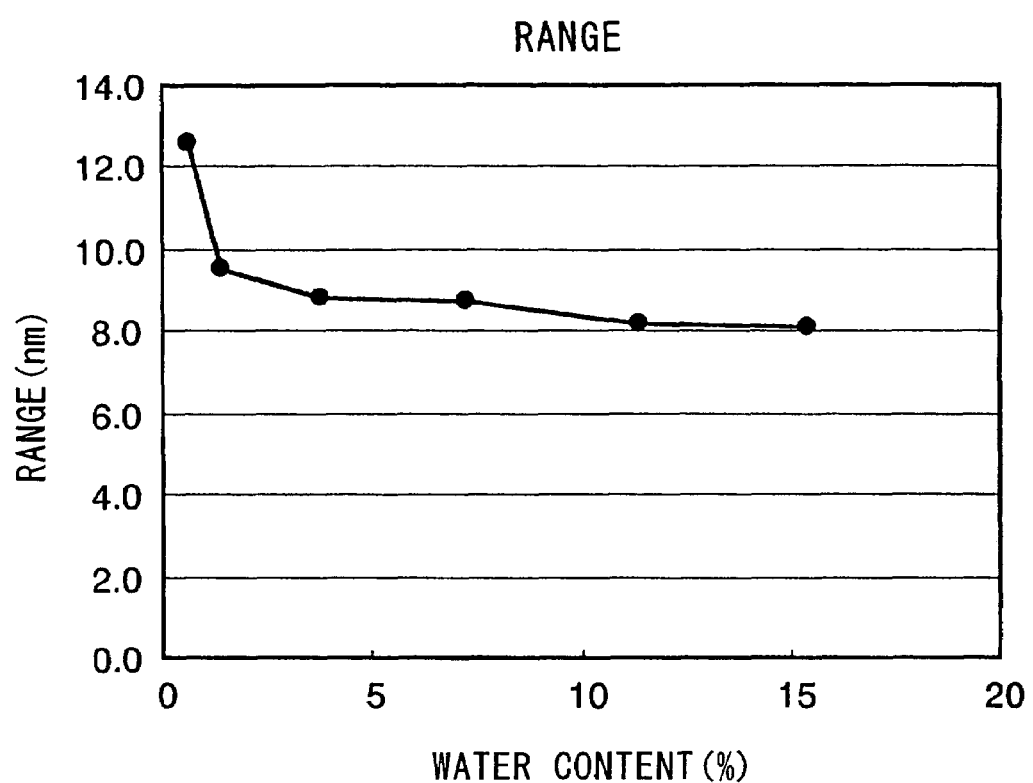
FIG. 3 is a graph showing the relationship between the range and the water content for a series of examples.

Each of the silica based films obtained in the above silica based film formation 1 was evaluated for (1) wet etching rate, (2) film thickness uniformity within the substrate surface, and (3) range, using the methods described below. The results of these evaluations are shown in FIG. 1 through FIG. 3 respectively.

(1) Wet Etching Rate

The substrate on which the silica based film had been formed was immersed for 3 minutes in a 0.25% by weight aqueous solution of hydrofluoric acid (at 25° C.), and the wet etching rate (nm/minute) was calculated from the difference between the film thickness prior to immersion and the film thickness following immersion.

In the case of the silica based film coated substrate formed using the material for forming a silica based film prepared in the example 1, because the etching rate for the film was extremely high, the wet etch time within the aqueous solution of hydrofluoric acid was reduced to 30 seconds.

As is evident from the results shown in FIG. 1, when the water content was within a range from 1.4 to 15.4% by weight, the wet etching rate was significantly reduced, and from the graph, it is clear that the results were particularly favorable in the range from 7 to 15% by weight.

(2) Film Thickness Uniformity within the Substrate Surface

Nine random points were selected on the surface of the substrate on which had been formed the silica based film obtained in the above silica based film formation 1, and the film thickness at these 9 points was measured using an ellipsometer. The value represented by the following equation (the film thickness uniformity) was then determined, and the results were plotted to produce the graph shown in FIG. 2.

Film thickness uniformity=(MAX−MIN)/(2×Ave)

(wherein, MAX represents the maximum film thickness (nm) amongst the 9 points, MIN represents the minimum film thickness (nm) amongst the 9 points, and Ave represents the average film thickness value (nm) across the 9 points).

As is evident from the results shown in FIG. 2, as the water content increases, the uniformity improves, and from the graph, it is clear that the results were particularly favorable in the range from 7 to 15% by weight.

(3) Range

Nine random points were selected on the surface of the substrate on which had been formed the silica based film obtained in the above silica based film formation 1, and the film thickness at these 9 points was measured using an ellipsometer. The value represented by the following equation (the range) was then determined, and the results were plotted to produce the graph shown in FIG. 3.

Range=(MAX−MIN)

(wherein, MAX represents the maximum film thickness (nm) amongst the 9 points, and MIN represents the minimum film thickness (nm) amongst the 9 points)

As is evident from the results shown in FIG. 3, as the water content increases, the range decreases, and from the graph, it is clear that the results were particularly favorable in the range from 7 to 15% by weight.

(Evaluation of Characteristics 2)

Figure 4:
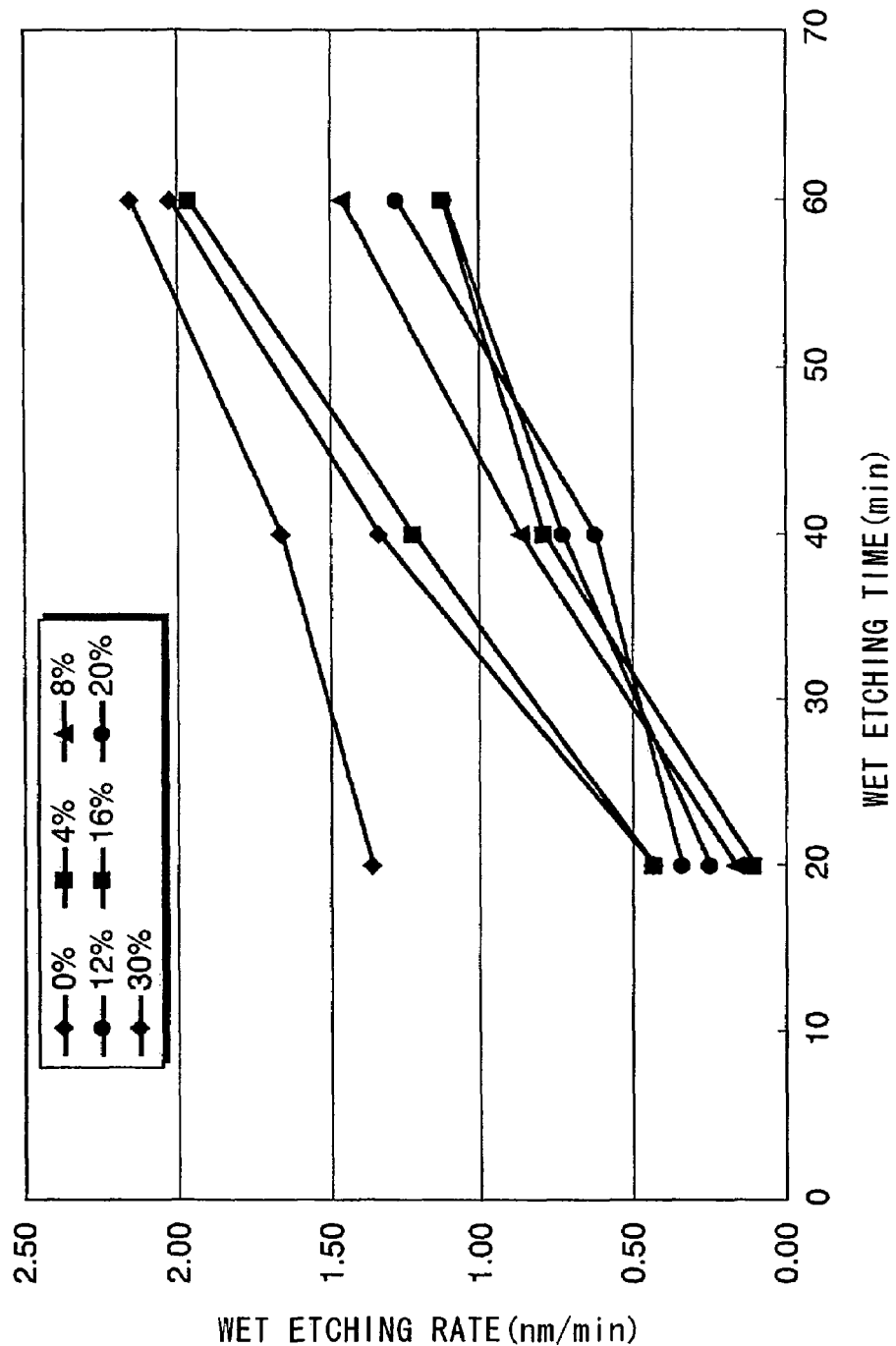
FIG. 4 is a graph showing the relationship between the wet etching rate and the wet etch time for a series of examples.

Each of the silica based films obtained in the above silica based film formation 2 was evaluated in terms of (4) the wet etching rate, using the method described below. The results of these evaluations are shown in FIG. 4.

(4) Wet Etching Rate

The substrate on which the silica based film had been formed was immersed for 20 minutes in a 0.5% by weight aqueous solution of hydrofluoric acid (at 25° C.), and the wet etching rate 1 (nm/minute) for the wet etch time from 0 to 20 minutes was calculated from the difference between the film thickness prior to immersion and the film thickness following immersion.

Subsequently, the same method was used to determine the film thickness following immersion for 40 minutes, and the film thickness following immersion for 60 minutes, and the wet etching rate 2 (nm/minute) for the wet etch time from 0 to 40 minutes, and the wet etching rate 3 (nm/minute) for the wet etch time from 0 to 60 minutes, were calculated.

The results of plotting the wet etching rates 1 to 3 for silica based films in which the water content was 0%, 4%, 8%, 12%, 16%, 20% and 30% respectively are shown in FIG. 4.

As is evident from the results shown in FIG. 4, the wet etching rate was highest when the water content was 0% by weight, indicating clearly that the film is prone to etching.

Furthermore, for water content values within a range from 8 to 20% by weight, the wet etching rate was reduced markedly. From the graph, it can be predicted that the results are likely to be particularly favorable in the range from 5 to 28% by weight, and most favorable within a range from 12 to 25% by weight.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A material for forming a silica based film comprising a solid fraction containing a film forming component capable of generating a silica based film, an organic solvent, and water, wherein the water content of said material, as determined by gas chromatography measurement, is within a range from 0.1 to 50% by weight,
and wherein said film forming component comprises a reaction product generated by subjecting a silicon compound selected from the group consisting of a compound represented by general formula I shown below and a compound represented by general formula II shown below, to hydrolysis:
$R^1{}_2Si(OR^2)_2$ (I), wherein $R^1$ is an alkyl group having 1–4 carbon atoms or a phenyl group, and $R^2$ is an alkyl group having 1–4 carbon atoms; and
$R^3Si(OR^4)_3$ (II), wherein $R^3$ is an alkyl group having 1–4 carbon atoms or a phenyl group, and $R^4$ is an alkyl group having 1–4 carbon atoms (II).

2. A material for forming a silica based film according to claim 1, wherein a Si content of said solid fraction is within a range from 5 to 20% by weight.

3. A material for forming a silica based film according to claim 1, wherein the water content determined by gas chromatography measurement is within a range from 1 to 30% by weight.

4. A method for producing a silica film-forming material comprising a hydrolysate of a silicon compound and water, wherein the water content of said material, as determined by gas chromatography measurement, is within a range from 0.1 to 50% by weight, said method comprising:
dissolving a silicon compound in an organic solvent to form a silicon compound solution,
wherein said silicon compound is selected from the group consisting of a compound represented by general formula I and a compound represented by general formula II, shown below:
$R^1{}_2Si(OR^2)_2$ (I), wherein $R^1$ is an alkyl group having 1–4 carbon atoms or a phenyl group, and R2 is an alkyl group having 1–4 carbon atoms; and
$R^3Si(OR^4)_3$ (II), wherein $R^3$ is an alkyl group having 1–4 carbon atoms or a phenyl group, and R4 is an alkyl group having 1–4 carbon atoms;
hydrolyzing said silicon compound solution with an acid catalyst and water to obtain said hydrolysate; and
adding water to said hydrolysate to adjust said water content of said material, thereby satisfying said range.

5. A material for forming a silica based film according to claim 1, wherein said reaction product is generated by subjecting said silicon compound to hydrolysis in the presence of an acid catalyst and water.

6. The method according to claim 4, wherein said water content of said material is within a range from 1 to 30% by weight.

7. The method according to claim 6, wherein said water content of said material is within a range from 3 to 20% by weight.

8. The method according to claim 4, wherein said hydrolysate comprises siloxane oligomers with degrees of polymerization from 2 to 20.

9. The method according to claim 8, wherein said siloxane oligomers have a weight average molecular weight within a range from 1,000 to 10,000.

10. A material for forming a silica based film for insulation provided on top of a metal wiring pattern comprising a solid fraction comprising an organic group-containing film-forming component capable of generating a silica based film, an organic solvent, and water, wherein said organic group-containing, film-forming component comprises a reaction product generated by subjecting a silicon compound selected from the group consisting of a compound represented by general formula I and a compound represented by general formula II shown below, to hydrolysis:

$R^1{}_2Si(OR^2)_2$ (I), wherein $R^1$ is an alkyl group having 1–4 carbon atoms or a phenyl group, and R2 is an alkyl group having 1–4 carbon atoms;

$R^3Si(OR^4)_3$ (II), wherein $R^3$ is an alkyl group having 1–4 carbon atoms or a phenyl group, and R4 is an alkyl group having 1–4 carbon atoms (II), wherein the water content of said material, as determined by gas chromatography measurement, is between 12 and 25% by weight.

11. A material for forming a silica based film according to claim 10, wherein the silicon content of said solid fraction is between 1 and 20% by weight.

12. A material for forming a silica based film according to claim 10, wherein said reaction product is generated by subjecting said silicon compound to hydrolysis in the presence of an acid catalyst and water.

13. A method for forming a silica based film for insulation provided on top of a metal wiring pattern, by diluting or not diluting, comprising applying a material on top of the metal wiring pattern, wherein said material comprises a solid fraction comprising an organic group-containing, film-forming component capable of generating a silica based film, an organic solvent, and water, wherein said organic group-containing, film-forming component comprises a reaction product generated by subjecting a silicon compound selected from the group consisting of a compound represented by general formula I and a compound represented by general formula II shown below, to hydrolysis:

$R^1{}_2Si(OR^2)_2$ (I), wherein $R^1$ is an alkyl group having 1–4 carbon atoms or a phenyl group, and $R^2$ is an alkyl group having 1–4 carbon atoms; and $R^3Si(OR^4)_3$ (II), wherein $R^3$ is an alkyl group having 1–4 carbon atoms or a phenyl group, and $R^4$ is an alkyl group having 1–4 carbon atoms, and wherein said material has a water content, as determined by gas chromatography, of 12–25% by weight.

14. The method according to claim 13, wherein said solid fraction has a silicon content of between 1 and 20% by weight.

15. A material for forming a silica based film according to claim 13, wherein said reaction product is generated by subjecting said silicon compound to hydrolysis in the presence of an acid catalyst and water.

* * * * *